United States Patent
Park et al.

(10) Patent No.: US 8,114,778 B2
(45) Date of Patent: Feb. 14, 2012

(54) METHOD OF FORMING MINUTE PATTERNS IN SEMICONDUCTOR DEVICE USING DOUBLE PATTERNING

(75) Inventors: Sang-yong Park, Suwon-si (KR); Jae-kwan Park, Suwon-si (KR); Yong-sik Yim, Seongnam-si (KR); Jae-hwang Sim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/905,318

(22) Filed: Oct. 15, 2010

(65) Prior Publication Data

US 2011/0034030 A1 Feb. 10, 2011

Related U.S. Application Data

(62) Division of application No. 12/453,307, filed on May 6, 2009, now Pat. No. 7,816,270.

(30) Foreign Application Priority Data

May 19, 2008 (KR) ......................... 10-2008-0046287

(51) Int. Cl.
*H01L 21/311* (2006.01)

(52) U.S. Cl. ........ 438/700; 438/717; 438/723; 438/734; 257/E21.249

(58) Field of Classification Search .................. 438/700, 438/702, 703, 717, 723, 734; 257/E21.249
See application file for complete search history.

(56) References Cited

U.S. PATENT DOCUMENTS

| 7,202,174 B1 | 4/2007 | Jung et al. |
| 7,550,391 B2 | 6/2009 | Jeon et al. |
| 7,687,369 B2 | 3/2010 | Koh et al. |
| 7,842,601 B2 * | 11/2010 | Lee et al. ..................... 438/622 |
| 2006/0240361 A1 | 10/2006 | Lee et al. |

FOREIGN PATENT DOCUMENTS

| KR | 10-2006-0110706 A | 10/2006 |
| KR | 10-0672123 B1 | 1/2007 |
| KR | 10-0746618 B1 | 7/2007 |

* cited by examiner

*Primary Examiner* — Jack Chen
(74) *Attorney, Agent, or Firm* — Lee & Morse, P.C.

(57) ABSTRACT

A method of forming minute patterns in a semiconductor device, and more particularly, a method of forming minute patterns in a semiconductor device having an even number of insert patterns between basic patterns by double patterning including insert patterns between a first basic pattern and a second basic pattern which are transversely separated from each other on a semiconductor substrate, wherein a first insert pattern and a second insert pattern are alternately repeated to form the insert patterns, the method includes the operation of performing a partial etching toward the second insert pattern adjacent to the second basic pattern, or the operation of forming a shielding layer pattern, thereby forming the even number of insert patterns.

8 Claims, 15 Drawing Sheets

METHOD OF FORMING MINUTE PATTERNS IN SEMICONDUCTOR DEVICE USING DOUBLE PATTERNING

CROSS REFERENCE TO RELATED APPLICATION

This is a divisional application based on application Ser. No. 12/453,307 filed May 6, 2009, now U.S. Pat. No. 7,816,270 the entire contents of which is hereby incorporated by reference.

BACKGROUND OF THE INVENTION

1. Field of the Invention

The present invention relates to a method of forming minute patterns in a semiconductor device and, more particularly, to a method of forming minute patterns in a semiconductor device by double patterning.

2. Description of the Related Art

Minute patterns are essential for high integration of a semiconductor device. In order to integrate many devices in a small region, the size of each device has to be small, thus, a feature P, the sum of a width of each pattern to be formed and a distance between each pattern, has to be small. Recently, due to a sharp decrease of a device design rule, a photolithography process of forming a pattern, in particular, a line and space pattern to realize a semiconductor device, has resolution limits. As the result of the resolution limits, there are limitations to forming a pattern having a minute feature.

In order to overcome the resolution limits in the photolithography process, a method of forming minute patterns by double patterning has been presented.

FIGS. 1A through 1E illustrate cross-sectional views of stages describing a conventional method of forming a semiconductor device.

Referring to FIG. 1A, a first oxide layer 14 and a poly-silicon layer 15 are sequentially stacked on a substrate 11. Adequate material layers may be further formed between the substrate 11 and the first oxide layer 14. For example, a gate insulating layer 12 and a tungsten layer 13 may be sequentially formed on the substrate 11.

Photoresist layer patterns 16-1, 16-2, and 16-3 are formed on the poly-silicon layer 15. A plurality of photoresist layer patterns 16-1 separated from each other by a uniform distance and each having a width corresponding to a first feature size $1f$ is formed between the photoresist layer pattern 16-2 and the photoresist layer pattern 16-3. For example, the photoresist layer pattern 16-2 is disposed at a position corresponding to a GSL (Ground Select Line), the photoresist layer pattern 16-3 is disposed at a position corresponding to an SSL (String Select Line), and the photoresist layer patterns 16-1 are disposed at positions respectively corresponding to word lines.

The photoresist layer patterns 16-1, 16-2, and 16-3 are separated from each other by a uniform distance, that is, they are separated from each other by a third feature size $3f$ that is three times as wide as the first feature size $1f$. Thus, the photoresist layer pattern 16-2 and the photoresist layer pattern 16-3 are individually separated from their most adjacent photoresist layer pattern 16-1 by the third feature size $3f$.

Referring to FIG. 1B, the photoresist layer patterns 16-1, 16-2, and 16-3 are used as an etching mask to etch the poly-silicon layer 15 to form first poly-silicon layer patterns 15a-1, 15a-2, and 15a-3. The first poly-silicon layer patterns 15a-1, 15a-2, and 15a-3, which are adjacent to each other, are separated from each other by the third feature size $3f$.

Referring to FIG. 1C, a second oxide layer 17 is formed to uniformly cover the first poly-silicon layer patterns 15a-1, 15a-2, and 15a-3. A thickness of the second oxide layer 17 is the same as the first feature size $1f$. Thus, a distance between each adjacent second oxide layers 17 is the same as the first feature size $1f$.

Referring to FIG. 1D, a plurality of second poly-silicon layer patterns 18 individually fill a space between each adjacent second oxide layers 17. If an even number $2n$ of the first poly-silicon layer patterns 15a-1 are formed, then an odd number $2n+1$ of the second poly-silicon layer patterns 18 are formed. If an odd number $2n-1$ of the first poly-silicon layer patterns 15a-1 are formed, then an even number $2n$ of the second poly-silicon layer patterns 18 are formed. Thus, an odd number of the first poly-silicon layer patterns 15a-1 and the second poly-silicon layer patterns 18, each having the first feature size $1f$, are formed between the first poly-silicon layer pattern 15a-2 corresponding to the GSL and the first poly-silicon layer pattern 15a-3 corresponding to the SSL. Thus, the conventional method has a problem in forming an even number of the first poly-silicon layer patterns 15a-1 and the second poly-silicon layer patterns 18, each having the first feature size $1f$, between the first poly-silicon layer pattern 15a-2 corresponding to the GSL and the first poly-silicon layer pattern 15a-3 corresponding to the SSL. In order to use an even number of the first poly-silicon layer patterns 15a-1 and the second poly-silicon layer patterns 18, an odd number of patterns randomly selected among the first poly-silicon layer patterns 15a-1 and the second poly-silicon layer patterns 18 have to be used as dummy patterns. However, this method is not desirable since a symmetric structure is not achieved.

FIG. 5 illustrates a plane view of a semiconductor device formed using a conventional double patterning method. Referring to FIG. 5, an odd number of insert patterns are formed between a first basic pattern (e.g., a GSL pattern) and a second basic pattern (e.g., an SSL pattern). In the case where an even number of insert patterns among the odd number of insert patterns are used as word line patterns WL0 through WL31, two dummy patterns should be used between the first basic pattern (e.g., the GSL pattern) and the word line pattern WL0, and one dummy pattern should be used between the second basic pattern (e.g., the SSL pattern) and the word line pattern WL31. Such an asymmetric structure may cause an undesirable result in a gate operation.

Referring back to FIG. 1E, the first poly-silicon layer patterns 15a-1, 15a-2, and 15a-3, and the second poly-silicon layer patterns 18 are used as an etching mask to etch the second oxide layer 17 and a first oxide layer 14a. After that, the tungsten layer 13 and the gate insulating layer 12 are etched to form a tungsten layer pattern 13a-2 and a gate insulating layer pattern 12a-2. As the result of the etching, an odd number of word line patterns 14b-1 are formed between a GSL 14b-2 and an SSL 14b-3.

Accordingly, there is a need to develop a method of forming an even number of insert patterns between a first basic pattern and a second basic pattern by double patterning.

SUMMARY OF THE INVENTION

The present invention provides a method of manufacturing a semiconductor device having an even number of insert patterns between a first basic pattern and a second basic pattern by double patterning.

According to an embodiment of the present invention, there is provided a method of manufacturing a semiconductor device in which an even number of insert patterns are formed by double patterning between a first basic pattern disposed at a left side and a second basic pattern disposed at a right side which are transversely separated from each other on a semiconductor substrate, wherein a first insert pattern and a second insert pattern are alternately repeated to form the insert patterns, the method including the operations of forming a first material layer on the semiconductor substrate; forming a first pattern of a second material layer on the first material layer, wherein the first pattern of the second material layer includes a trench that is partially and vertically etched from an upper surface of the first pattern; forming hardmask layer patterns on the first pattern of the second material layer, wherein the hardmask layer patterns respectively correspond to a region where the first basic pattern, a region where the second basic pattern and a region where the first insert pattern are to be subsequently formed; using the hardmask layer patterns as an etching mask to etch the first pattern of the second material to expose the first material layer, thereby forming second patterns of the second material layer; forming a first pattern of a third material layer on the second patterns of the second material layer to form a plurality of first spaces between the adjacent second patterns; forming first patterns of a fourth material layer on the first pattern of the third material layer, thereby covering the plurality of first spaces; and using the second patterns of the second material layer and the first patterns of the fourth material layer as an etching mask to etch the first pattern of the third material layer, and then to etch the first material layer, thereby forming a first pattern of the first material layer including the first basic pattern, the second basic pattern, the first insert pattern, and the second insert pattern, wherein the trench is disposed on the region where the second basic pattern is to be subsequently formed, and a hardmask layer pattern among the hardmask layer patterns is arranged such that a left side surface of the hardmask layer pattern corresponding to the region of the second basic pattern is located inside the trench, and a right side surface of the hardmask layer pattern is located outside the trench.

The trench that is partially etched has a first height, and when a part below a bottom surface of the trench in the first pattern of the second material layer has a second height, the second height is sufficient to enable the second material layer to remain as the etching mask while the etching is performed.

The horizontal thickness of the hardmask layer pattern formed inside the trench is greater than a horizontal thickness of the first pattern of the third material layer formed inside the trench.

The hardmask layer patterns have a uniform distance between each adjacent hardmask layer.

The third material layer has etch selectivity not equal to one with respect to the second material layer and the fourth material layer. The first material layer has etch selectivity not equal to one with respect to the second material layer and the fourth material layer. The first material layer, the second material layer, the third material layer and the fourth material layer include a silicon oxide layer, a poly-silicon layer, a silicon oxide layer, and a poly-silicon layer, respectively.

The hardmask layer patterns include a photoresist layer pattern. Prior to forming the first pattern of the third material layer, the hardmask patterns are removed.

A horizontal width of each insert pattern corresponds to a first feature size. A distance between each adjacent insert patterns corresponds to the first feature size, a distance between each adjacent hardmask layer patterns corresponds to a size that is three times as wide as the first feature size, and a horizontal width of the first pattern of the third material layer corresponds to the first feature size.

The horizontal thickness of the hardmask layer pattern formed inside the trench corresponds to a size that is twice as wide as the first feature size.

A distance between the first basic pattern and an insert pattern among the insert patterns, wherein the insert pattern is most adjacent to the first basic pattern, is the same as a distance between the second basic pattern and an insert pattern among the insert patterns, wherein the insert pattern is most adjacent to the second basic pattern.

At least one of the above features and other advantages may be realized by providing a method of manufacturing a semiconductor device in which an even number of insert patterns are formed by double patterning between a first basic pattern disposed at a left side and a second basic pattern disposed at a right side which are transversely separated from each other on a semiconductor substrate, wherein a first insert pattern and a second insert pattern are alternately repeated to form the insert patterns, the method including the operations of forming a first material layer on the semiconductor substrate; forming first patterns of a second material layer on the first material layer, wherein the first patterns of the second material layer respectively correspond to a region where the first basic pattern, a region where the second basic pattern, and a region where the first insert pattern are to be subsequently formed; forming a first pattern of a third material layer on the first patterns of the second material layer to form a plurality of first spaces between the adjacent first patterns; forming first patterns of a fourth material layer on the first pattern of the third material layer, thereby covering the plurality of first spaces; forming a shielding layer pattern to completely cover a top surface of the first pattern of the third material layer disposed between a first pattern among the first patterns of the second material layer, and a first pattern among the first patterns of the fourth material layer, wherein the first pattern among the first patterns of the second material layer is on the region where the second basic pattern is to be subsequently formed, and wherein the first pattern among the first patterns of the fourth material layer is most adjacent to the first pattern among the first patterns of the second material layer; and using the first patterns of the second material layer, the first patterns of the fourth material layer, and the shielding layer pattern as an etching mask to etch the first pattern of the third material layer, and then to etch the first material layer, thereby forming a first pattern of the first material layer including the first basic pattern, the second basic pattern, the first insert pattern, and the second insert pattern.

The shielding layer pattern is extended from the first pattern among the first patterns of the fourth material layer to the first pattern among the first patterns of the second material layer, wherein the first pattern among the first patterns of the fourth material layer is most adjacent to the first pattern among the first patterns of the second material layer and which are on the region where the second basic pattern is to be subsequently formed. The shielding layer pattern has a vertical thickness sufficient to enable the shielding layer pattern to remain as the etching mask while the etching is performed.

The third material layer has etch selectivity not equal to one with respect to the second material layer, the fourth material layer, and the shielding layer pattern. The first material layer has etch selectivity not equal to one with respect to the second material layer, the fourth material layer, and the shielding layer pattern.

The first material layer, the second material layer, the third material layer, the fourth material layer, and the shielding layer pattern include a silicon oxide layer, a poly-silicon layer, a silicon oxide layer, a poly-silicon layer, and a photoresist layer pattern, respectively.

A horizontal width of each insert pattern corresponds to a first feature size, a distance between each adjacent insert patterns corresponds to the first feature size, a distance between the first basic pattern and an insert pattern among the insert patterns, wherein the insert pattern is most adjacent to the first basic pattern, corresponds to the first feature size, and a distance between the second basic pattern and an insert pattern among the insert patterns, wherein the insert pattern is most adjacent to the second basic pattern, corresponds to the first feature size.

The distance between the first basic pattern and the insert pattern most adjacent to the first basic pattern is the same as the distance between the second basic pattern and the insert pattern most adjacent to the second basic pattern.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
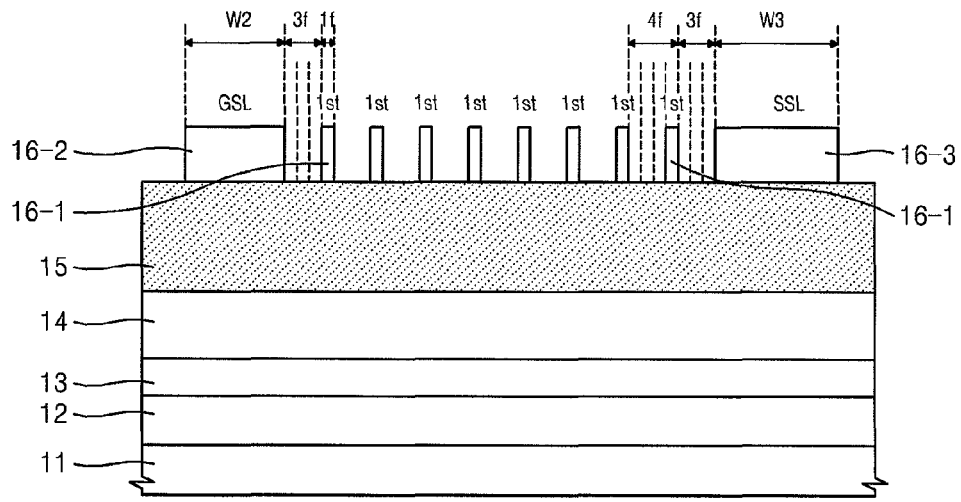
FIGS. 1A through 1E illustrate cross-sectional views of stages in a conventional method of forming a semiconductor device.
Figure 1B:
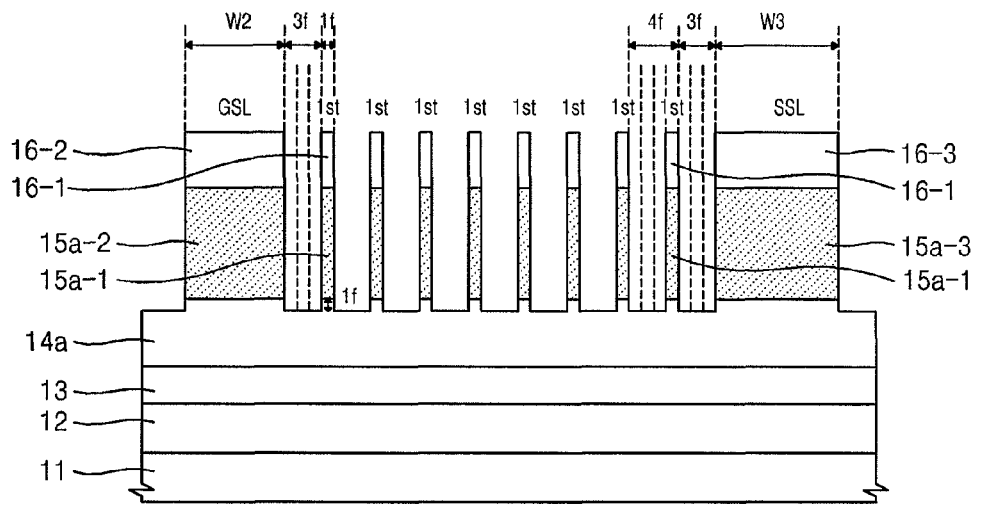
Figure 1C:
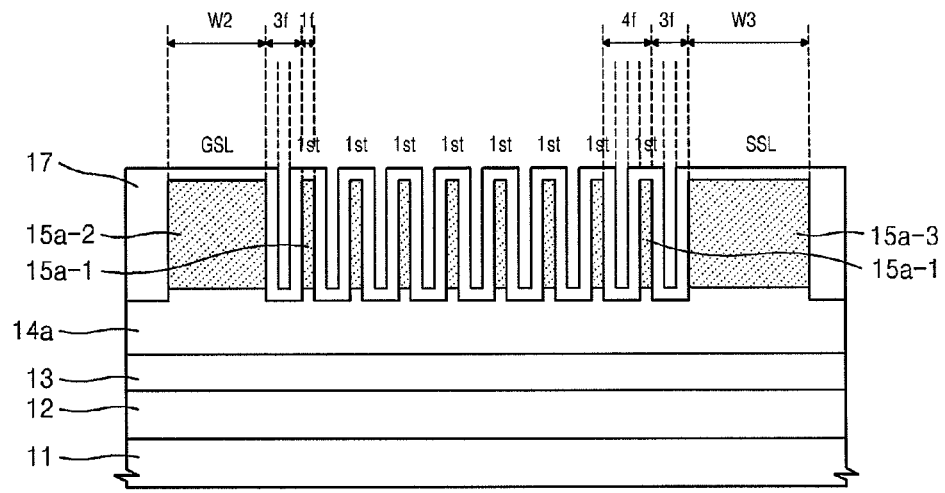
Figure 1D:
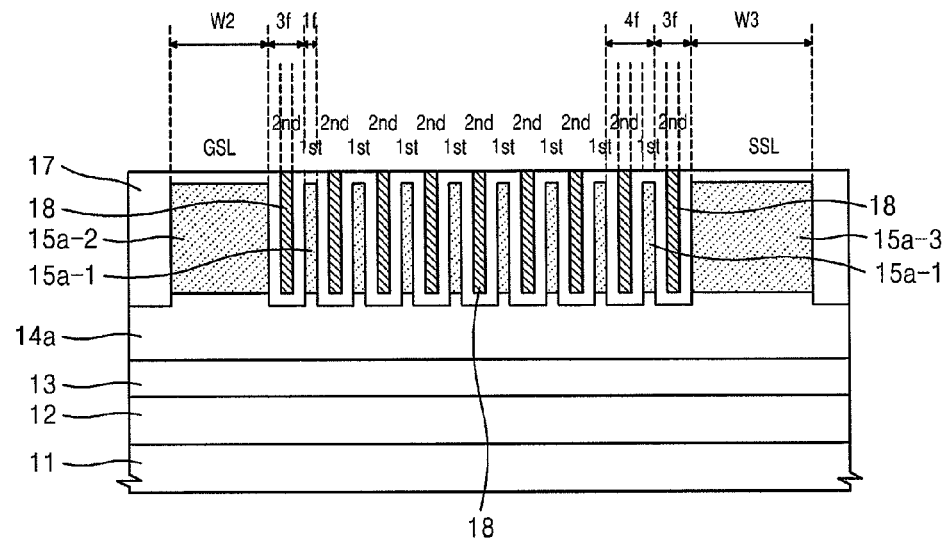
Figure 1E:
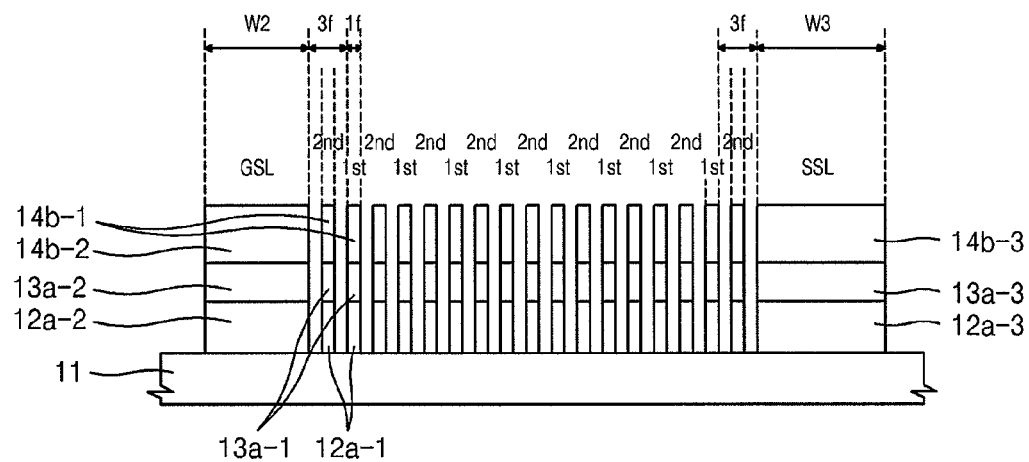

Korean Patent Application No. 10-2008-0046287, filed on May 19, 2008, in the Korean Intellectual Property Office, and entitled: "Method of Manufacturing Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, in embodiments of the present invention, an even number of insert patterns are formed by double patterning between a first basic pattern and a second basic pattern which are transversely separated from each other on a semiconductor substrate. A first insert pattern and a second insert pattern are alternately repeated to form the insert patterns.

FIGS. 2A through 2F illustrate cross-sectional views of stages describing a method of manufacturing a semiconductor device according to an embodiment of the present invention.

Figure 2A:
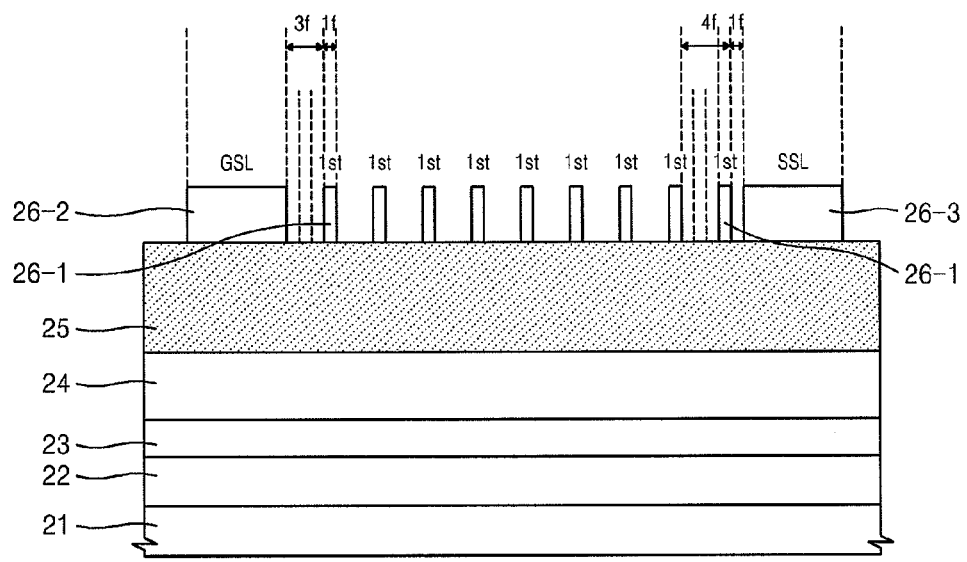
FIGS. 2A through 2F illustrate cross-sectional views of stages in a method of manufacturing a semiconductor device according to an embodiment of the present invention.

Referring to FIG. 2A, a first silicon oxide layer 24 and a first poly-silicon layer 25 are sequentially stacked on a substrate 21. Other material layers may be further formed between the substrate 21 and the first silicon oxide layer 24. For example, a TANOS layer 22 (TANOS indicates the sequentially stacked structure consisting of Si, $SiO_2$, $Si_3N_4$, $Al_2O_3$, and TaN layers) and a tungsten layer 23 may be further sequentially formed on the substrate 21 to form a gate pattern.

Photoresist layer patterns 26-1, 26-2, and 26-3 are formed on the first poly-silicon layer 25. A plurality of photoresist layer patterns 26-1, each having a width corresponding to a first feature size 1f, may be formed between the photoresist layer pattern 26-2 and the photoresist layer pattern 26-3.

For example, the photoresist layer pattern 26-2 is disposed at a position corresponding to a first basic pattern (e.g., a GSL) to be formed in a subsequent process, and the photoresist layer pattern 26-3 is disposed at a position corresponding to a second basic pattern (e.g., an SSL) to be formed in a subsequent process. The photoresist layer patterns 26-1, which are inserted between the photoresist layer patterns 26-2 and 26-3, are disposed at positions respectively corresponding to an even number of insert patterns (e.g., word lines) to be formed in a subsequent process.

The first silicon oxide layer 24 and the first poly-silicon layer 25 should have etch selectivity which is not equal to one (Here, etch selectivity is a ratio of the amount of an etch-target one material etched away versus the amount of the other material etched away in appropriate etching process with respect to each other). Also, each photoresist layer pattern 26-1 should have etch selectivity not equal to one with respect to the first silicon oxide layer 24 and the first poly-silicon layer 25.

In the method of manufacturing the semiconductor device according to the current embodiment of the present invention, a distance between the photoresist layer pattern 26-2 and a photoresist layer pattern among the photoresist layer patterns 26-1, wherein the photoresist layer pattern is most adjacent to the photoresist layer pattern 26-2, is different from a distance between the photoresist layer pattern 26-3 and a photoresist layer pattern among the photoresist layer patterns 26-1, wherein the photoresist layer pattern is most adjacent to the photoresist layer pattern 26-3.

For example, the distance between the photoresist layer pattern 26-2 and the photoresist layer pattern most adjacent to the photoresist layer pattern 26-2 may correspond to a third feature size 3f that is three times as wide as the first feature size 1f, while the distance between the photoresist layer pattern 26-3 and the photoresist layer pattern most adjacent to the photoresist layer pattern 26-3 may correspond to the first feature size 1f. Due to such asymmetry between the distances, the smaller the feature size of a pattern, the higher the burden of a photolithography process.

A distance between each photoresist layer pattern 26-1 may correspond to the third feature size 3f.

Figure 2B:
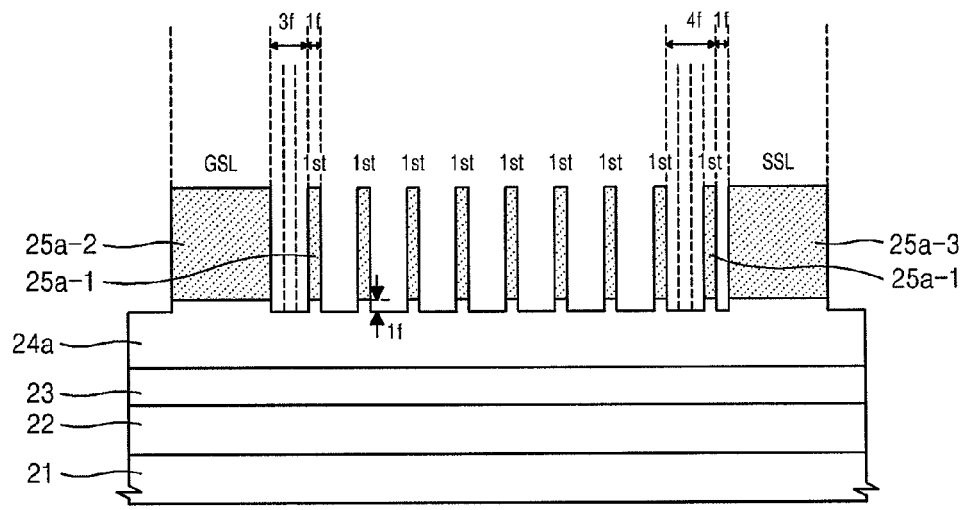

Referring to FIG. 2B, the photoresist layer patterns 26-1, 26-2, and 26-3 are used as an etching mask to etch the first poly-silicon layer 25 to form first poly-silicon layer patterns

25a-1, 25a-2, and 25a-3. In this etching process, over-etching may be vertically performed by as much as the first feature size 1f.

A distance between the first poly-silicon layer pattern 25a-2 and a first poly-silicon layer pattern 25a-1 that is most adjacent to the first poly-silicon layer pattern 25a-2 may correspond to the third feature size 3f, wherein the first poly-silicon layer pattern 25a-2 is disposed at the position corresponding to the first basic pattern (e.g., the GSL) to be formed in a subsequent process, and the first poly-silicon layer pattern among the first poly-silicon layer patterns 25a-1, which are disposed at the positions respectively corresponding to the insert patterns (e.g., the word lines) to be formed in a subsequent process.

A distance between the first poly-silicon layer pattern 25a-3 and a first poly-silicon layer pattern 25a-1 that is most adjacent to the first poly-silicon layer pattern 25a-3 may correspond to the first feature size 1f, wherein the first poly-silicon layer pattern 25a-3 is disposed at the position corresponding to the second basic pattern (e.g., the SSL) to be formed in a subsequent process, and the first poly-silicon layer pattern among the first poly-silicon layer patterns 25a-1, which are disposed at the positions respectively corresponding to the insert patterns (e.g., the word lines) to be formed in a subsequent process.

Figure 2C:
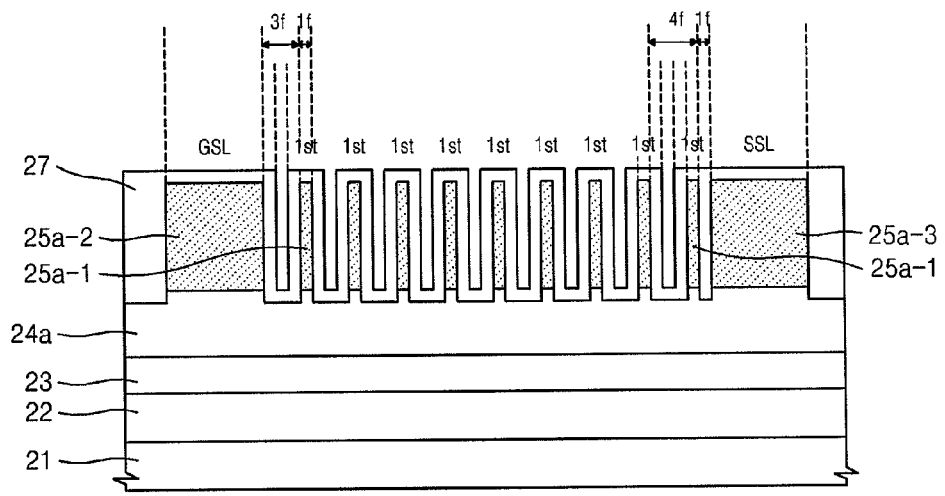

Referring to FIG. 2C, a second silicon oxide layer 27 is formed to uniformly cover the first poly-silicon layer patterns 25a-1, 25a-2, and 25a-3. A thickness of the second silicon oxide layer 27 may be the same as the first feature size 1f. Thus, a distance between each adjacent second oxide layer 27 may be the same as the first feature size 1f.

The second silicon oxide layer 27 fills a space between the first poly-silicon layer pattern 25a-3 and the first poly-silicon layer pattern 25a-1 that is most adjacent to the first poly-silicon layer pattern 25a-3, wherein the first poly-silicon layer pattern 25a-3 is disposed at the position corresponding to the second basic pattern (e.g., the SSL) to be formed in a subsequent process, and the first poly-silicon layer pattern among the first poly-silicon layer patterns 25a-1, which are disposed at the positions respectively corresponding to the insert patterns (e.g., the word lines) to be formed in a subsequent process, so that there is no space between the first poly-silicon layer pattern 25a-3 and the first poly-silicon layer pattern 25a-1 that is most adjacent to the first poly-silicon layer pattern 25a-3.

Figure 2D:
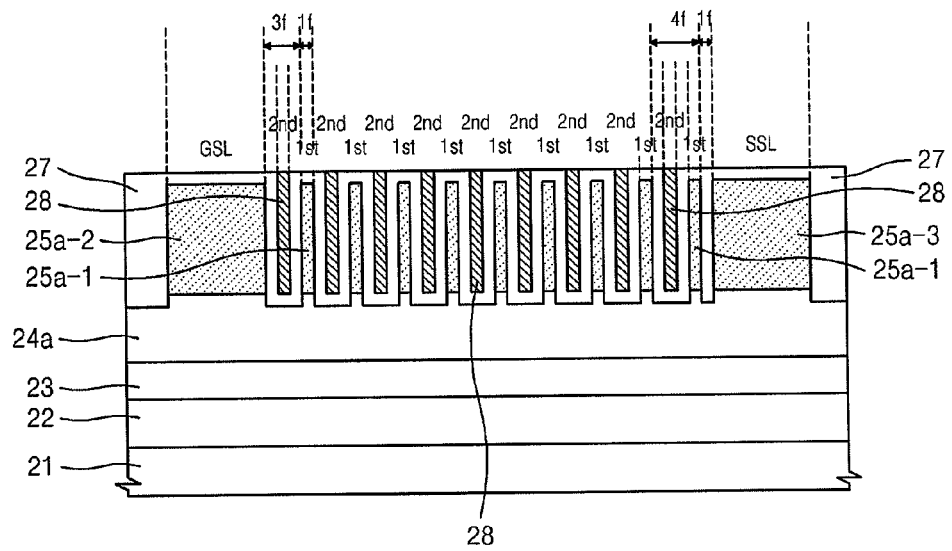

Referring to FIG. 2D, a plurality of second poly-silicon layer patterns 28 individually fill a space between the adjacent second silicon oxide layer 27. If an even number 2n of the first poly-silicon layer patterns 25a-1 are formed, an even number 2n of the second poly-silicon layer patterns 28 are also formed. If an odd number 2n−1 of the first poly-silicon layer patterns 25a-1 are formed, an odd number 2n−1 of the second poly-silicon layer patterns 28 are also formed.

Thus, unlike in the case of the conventional technology, an even number of the first poly-silicon layer patterns 25a-1 and the second poly-silicon layer patterns 28, each having the first feature size 1f, are formed between the first poly-silicon layer pattern 25a-2 corresponding to the first basic pattern (e.g., the GSL) and the first poly-silicon layer pattern 25a-3 corresponding to the second basic pattern (e.g., the SSL).

Figure 2E:
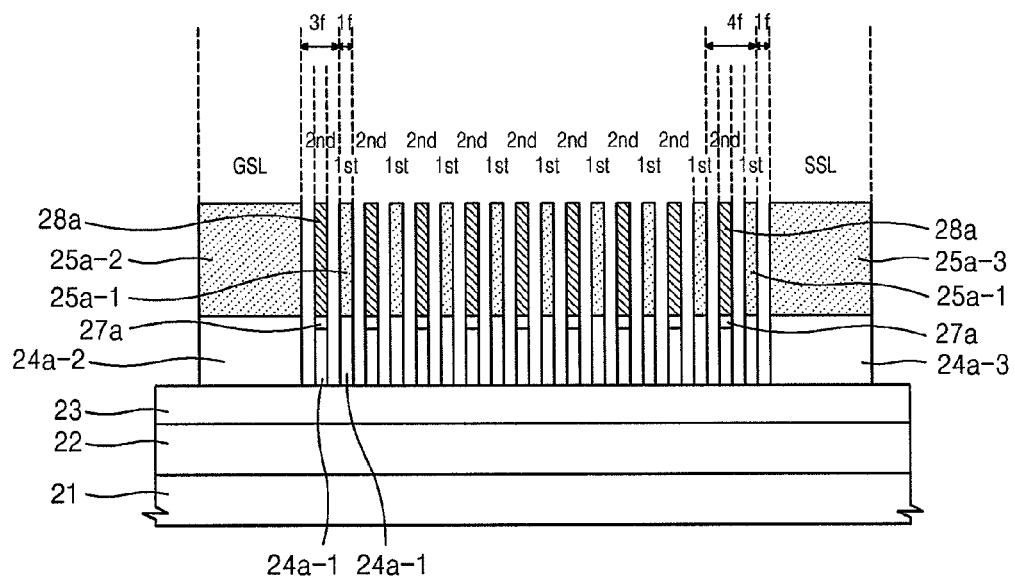
Figure 2F:
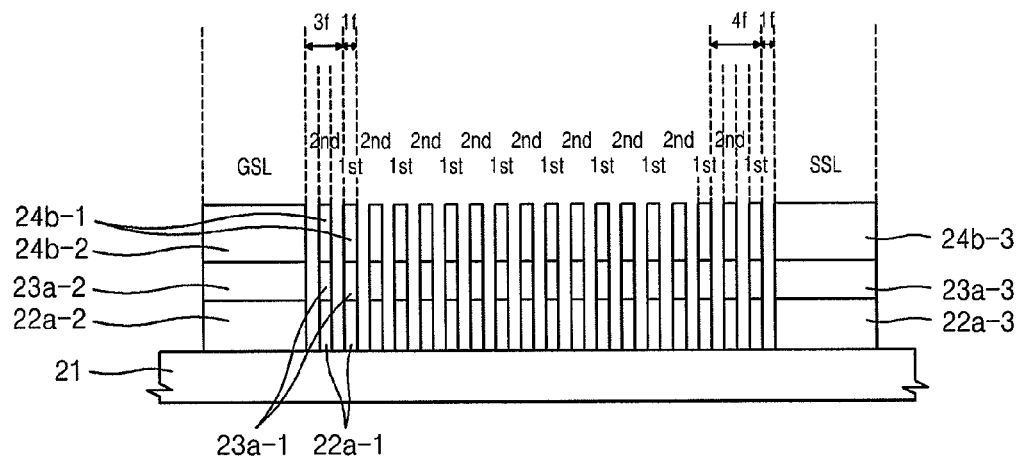

Referring to FIGS. 2E and 2F, the first poly-silicon layer patterns 25a-1, 25a-2, and 25a-3, and the second poly-silicon layer patterns 28 may be used as an etching mask to etch the second silicon oxide layer 27 and a first silicon oxide layer 24a, and then to etch the tungsten layer 23 and the TANOS layer 22. Thus, unlike in the case of the conventional technology, an even number of word line patterns may be formed between a GSL pattern and an SSL pattern.

Referring back to FIG. 2A, the distance (3f) between the photoresist layer pattern 26-2 and the photoresist layer pattern most adjacent to the photoresist layer pattern 26-2 is different from the distance (1f) between the photoresist layer pattern 26-3 and the photoresist layer pattern most adjacent to the photoresist layer pattern 26-3. Such asymmetry between the distances enables the formation of an even number of word line patterns.

FIGS. 3A through 3J illustrate cross-sectional views of stages describing a method of manufacturing a semiconductor device according to another embodiment of the present invention.

Figure 3A:
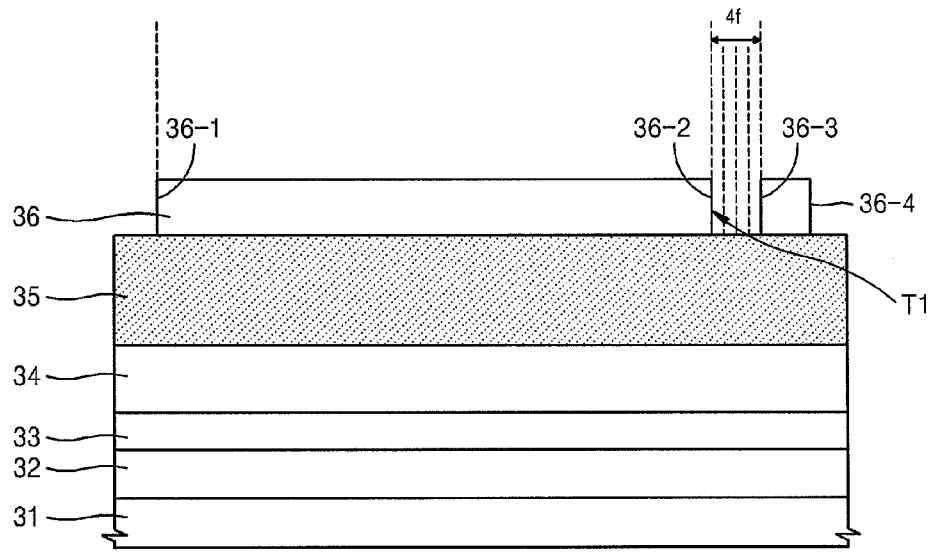
FIGS. 3A through 3J illustrate cross-sectional views of stages in a method of manufacturing a semiconductor device according to another embodiment of the present invention.

Referring to FIG. 3A, a first material layer 34 and a second material layer 35 are sequentially stacked on a substrate 31. Other material layers may be further formed between the substrate 31 and the first material layer 34. For example, a TANOS layer 32 and a tungsten layer 33 may be further sequentially formed on the substrate 31 to form a gate pattern.

A first hardmask layer pattern 36 is formed on the second material layer 35. The first hardmask layer pattern 36 may include a first trench T1 formed on one end of the first hardmask layer pattern 36 and exposing a portion of the second material layer 35. A left side surface 36-1 of the first hardmask layer pattern 36 may form a planar surface the same as a left side surface of a first basic pattern (e.g., a GSL pattern) to be formed in a subsequent process. A right side surface 36-4 of the first hardmask layer pattern 36 may form a planar surface that is the same as a right side surface of a second basic pattern (e.g., an SSL pattern) to be formed in a subsequent process.

The first trench T1 may be disposed on the second basic pattern (e.g., the SSL pattern) to be formed in a subsequent process. In the case where a feature size of each insert pattern to be formed in a subsequent process corresponds to a first feature size 1f, a width of the first trench T1 may correspond to a fourth feature size 4f that is four times as wide as the first feature size 1f.

Figure 3B:
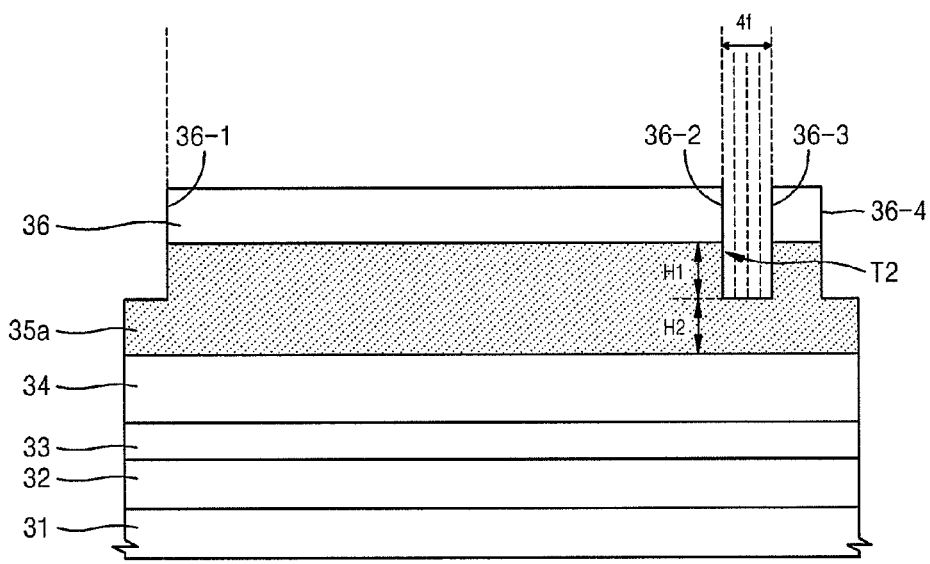

Referring to FIG. 3B, the first hardmask layer pattern 36 is used as an etching mask to partially and vertically etch the exposed second material layer 35, and then to form a first pattern 35a of the second material layer 35 including a second trench T2. The second trench T2 is formed to have a first height H1, and a second height H2 that is measured from a bottom surface of the first pattern 35a to a bottom surface of the second trench T2.

The first material layer 34 and the second material layer 35 should have etch selectivity not equal to one with respect to each other. Also, the first hardmask layer pattern 36 should have etch selectivity not equal to one with respect to each of the first material layer 34 and the second material layer 35. For example, the first material layer 34 may be a silicon oxide layer, the second material layer 35 may be a poly-silicon layer, and the first hardmask layer pattern 36 may be a photoresist layer pattern.

Figure 3C:
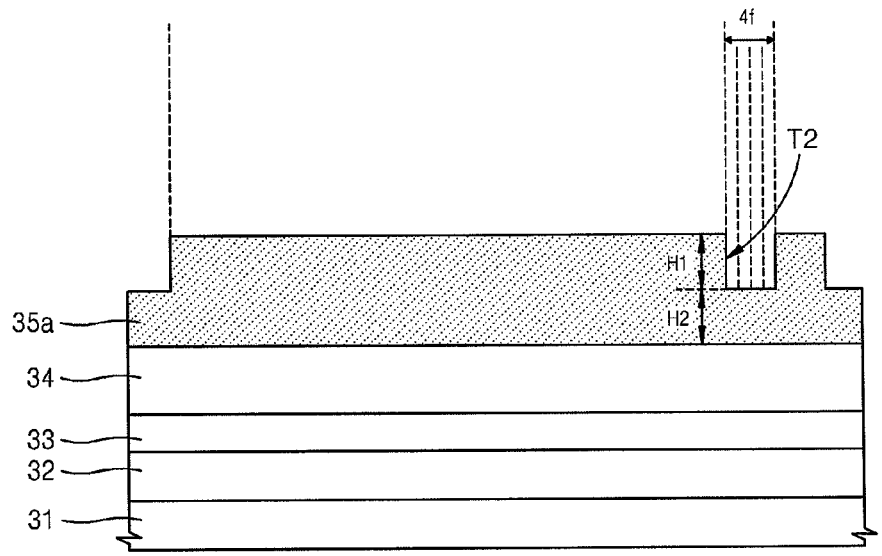

Referring to FIG. 3C, the first hardmask layer pattern 36 is completely removed to expose an entire top surface of the first pattern 35a.

Figure 3D:
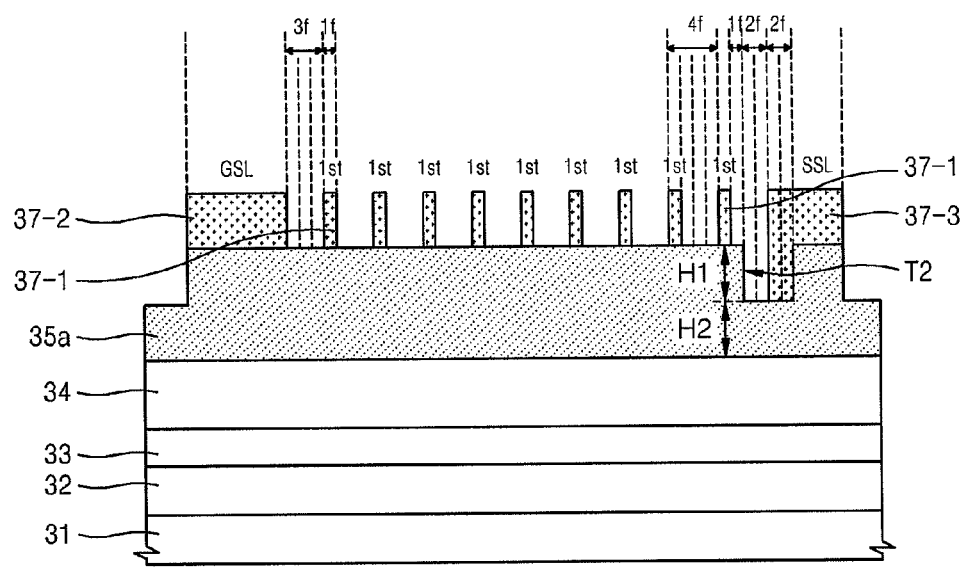

Referring to FIG. 3D, second hardmask layer patterns 37-2, 37-3, and 37-1 are formed on the top surface of the first pattern 35a. The second hardmask layer patterns 37-2, 37-3, and 37-1 respectively correspond to a region of the first basic pattern (e.g., the GSL pattern), a region of the second basic pattern (e.g., the SSL pattern), and a region of a first insert pattern (e.g., a word line pattern), which are to be formed in a subsequent process.

In particular, the second hardmask layer pattern 37-3 corresponding to the region of the second basic pattern (e.g., the SSL pattern) to be formed in a subsequent process is formed in such a manner that a left side surface of the second hardmask layer pattern 37-3 is located inside the second trench T2, and a right side surface of the second hardmask layer pattern 37-3 is located outside the second trench T2. For example, the left side surface of the second hardmask layer pattern 37-3 may be located in the center of the second trench T2, and the right side surface of the second hardmask layer pattern 37-3 may be located to form a planar surface that is the same as the right side surface of the second basic pattern (e.g., the SSL pattern) to be formed in a subsequent process. The second hardmask layer patterns 37-2, 37-3, and 37-1 may be photoresist layer patterns.

A width of each second hardmask layer pattern 37-1 corresponding to the region of the first insert pattern may correspond to the first feature size 1$f$. Also, the second hardmask layer patterns 37-2, 37-3, and 37-1 may be separated from each other by a uniform distance. For example, the uniform distance may correspond to a third feature size 3$f$ that is three times as wide as the first feature size 1$f$.

Figure 3E:
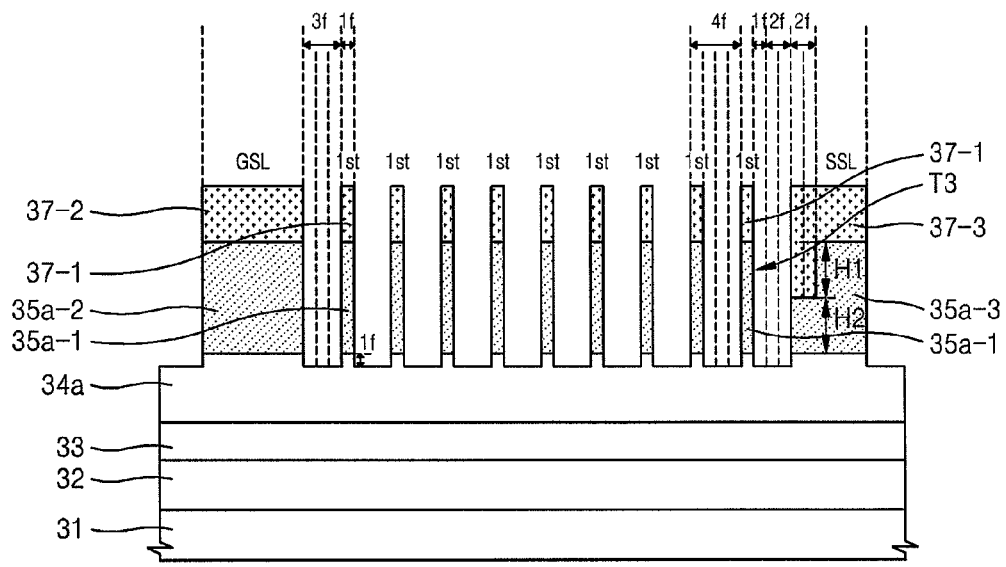

Referring to FIG. 3E, the second hardmask layer patterns 37-2, 37-3, and 37-1 are used as an etching mask to etch the exposed first pattern 35$a$, and then to form second patterns 35$a$-1, 35$a$-2, and 35$a$-3 of the second material layer 35. This etching process may be performed to expose the first material layer 34, and in this etching process, over-etching may be vertically performed by as much as the first feature size 1$f$.

Figure 3F:
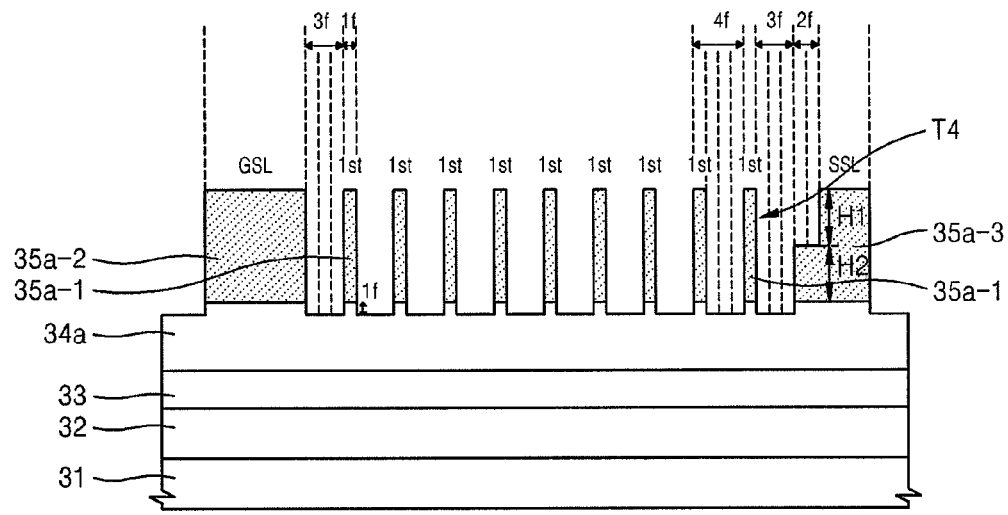

Referring to FIG. 3F, the second hardmask layer patterns 37-2, 37-3, and 37-1 are removed to expose all top surfaces of the second patterns 35$a$-1, 35$a$-2, and 35$a$-3. In particular, the second pattern 35$a$-3 corresponding to the second basic pattern (e.g., the SSL pattern) to be formed in a subsequent process may have a stepped shape, wherein a lower part of the stepped shape may have a second height H2 and an upper part of the stepped shape may have a first height H1. Also, a portion of the lower part exposed by the upper part in the stepped shape may have a width corresponding to a second feature size 2$f$ that is twice as wide as the first feature size 1$f$.

Figure 3G:
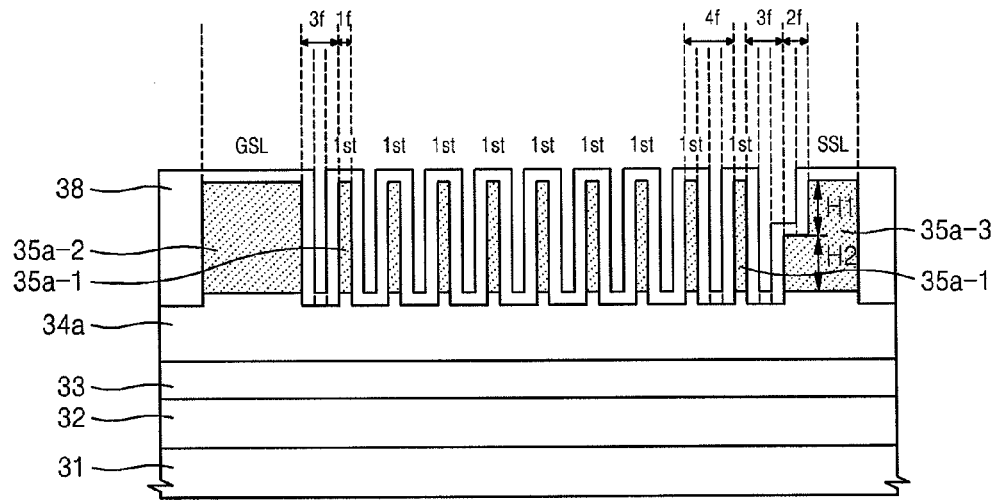

Referring to FIG. 3G, a first pattern 38 of a third material layer may be formed to have a uniform thickness on the second patterns 35$a$-1, 35$a$-2, and 35$a$-3. For example, the first pattern 38 may be formed to have a thickness of the first feature size 1$f$. Since the first pattern 38 is formed, a plurality of first spaces is formed between the second patterns 35$a$-1, 35$a$-2, and 35$a$-3 which are adjacent to each other. For example, a width of each first space may correspond to the first feature size 1$f$.

Figure 3H:
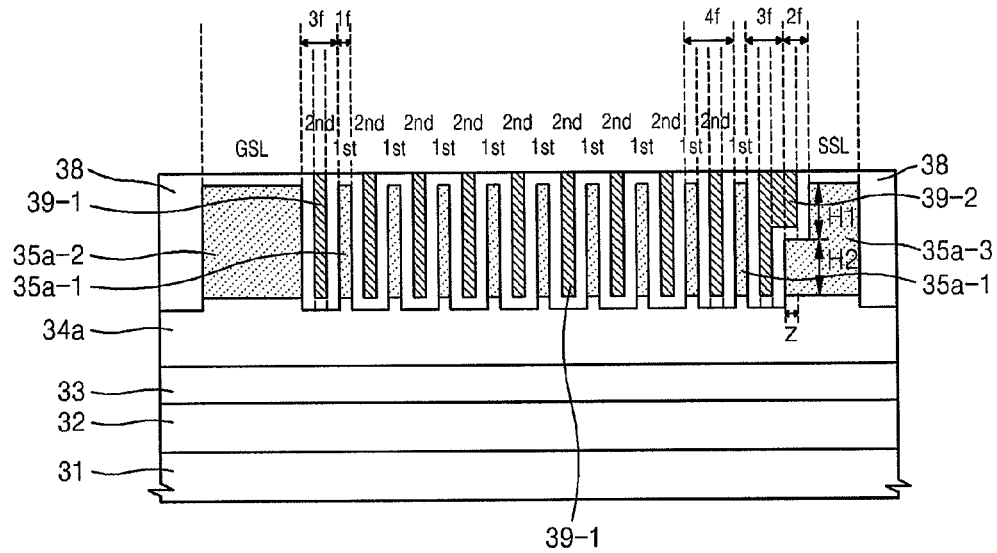

Referring to FIG. 3H, first patterns 39-1 and 39-2 of a fourth material layer are formed on the first pattern 38 to fill the first spaces. The first pattern 39-1 having a width of the first feature size 1$f$ corresponds to a region of a second insert pattern (e.g., a word line pattern) to be formed in a subsequent process. Meanwhile, the first pattern 39-2 formed in a region of the second trench T2 corresponds to a portion of the region of the second basic pattern (e.g., the SSL pattern) to be formed in a subsequent process.

In particular, referring to FIGS. 3D and 3G, a horizontal thickness of the second hardmask layer pattern 37-3 (see FIG. 3D) formed in a region corresponding to the second trench T2 should be greater than a horizontal thickness of the first pattern 38 (see FIG. 3G) formed in the region corresponding to the second trench T2. For example, a part indicated as Z in FIG. 3H may correspond to the first feature size 1$f$. The fourth material layer should have etch selectivity not equal to one with respect to the third material layer. Also, the fourth material layer should have etch selectivity not equal to one with respect to the first material layer 34. In the current embodiment of the present invention, the first patterns 39-1 and 39-2 of the fourth material layer may be formed as a poly-silicon layer.

Figure 3I:
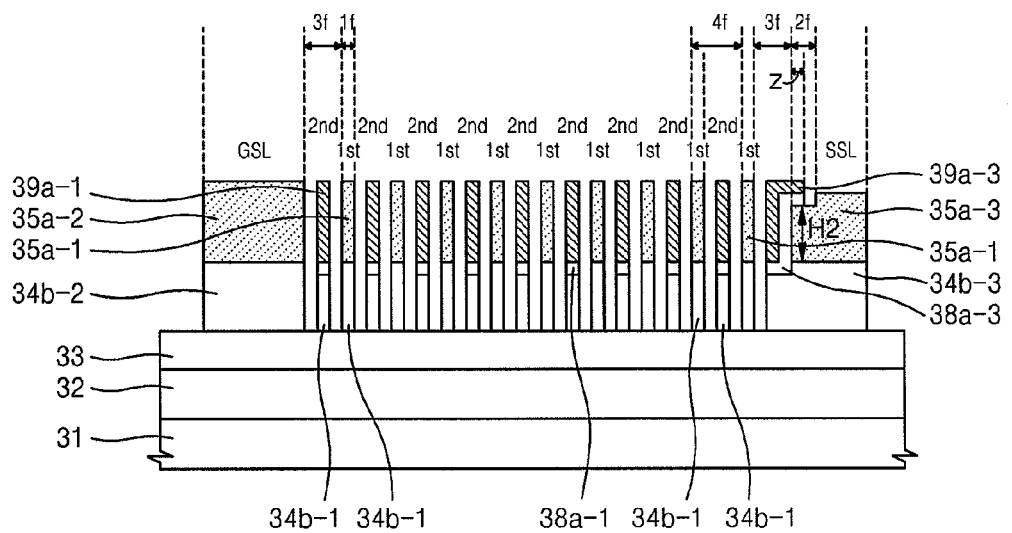

Referring to FIG. 3I, the second patterns 35$a$-1, 35$a$-2, and 35$a$-3 of the second material layer 35, and the first patterns 39-1 and 39-2 of the fourth material layer are used as an etching mask to etch the first pattern 38, and then to etch a first material layer 34$a$ to form first patterns 34$b$-2, 34$b$-3, and 34$b$-1 of the first material layer 34. To be more specific, the first patterns 34$b$-2, 34$b$-3, and 34$b$-1 include a first basic pattern 34$b$-2, a second basic pattern 34$b$-3, and a plurality of insert patterns 34$b$-1.

In particular, the second height H2 in the second pattern 35$a$-3 of the second material layer 35 should be sufficient to enable the second pattern 35$a$-3 to remain as the etching mask while the first pattern 38 and the first material layer 34$a$ are sequentially etched.

Figure 3J:
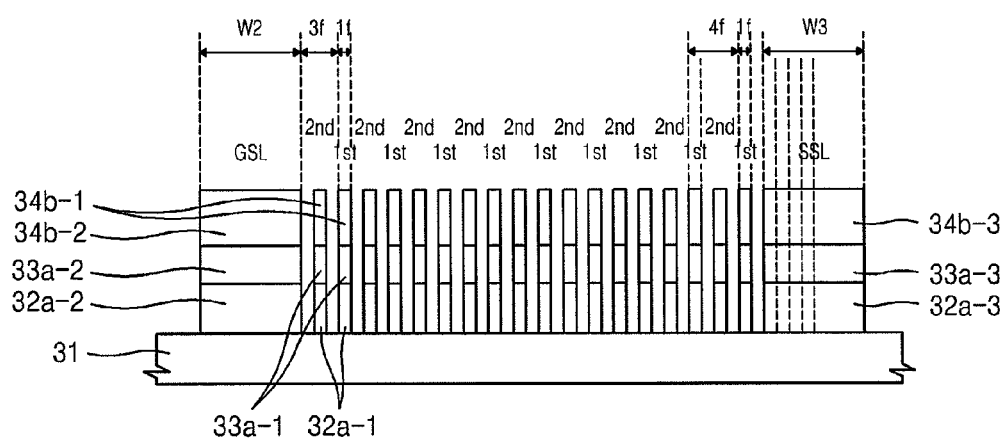

Referring to FIG. 3J, the first patterns 34$b$-2, 34$b$-3, and 34$b$-1 of the first material layer 34 are used as an etching mask to sequentially etch the exposed tungsten layer 33 and the exposed TANOS layer 32, so that the gate pattern is formed.

According to the current embodiment of the present invention, an even number of the insert patterns 34$b$-1 are formed between the first basic pattern 34$b$-2 and the second basic pattern 34$b$-3. Also, a distance between the first basic pattern 34$b$-2 and an insert pattern among the insert patterns 34$b$-1, wherein the insert pattern is most adjacent to the first basic pattern 34$b$-2, is the same as a distance between the second basic pattern 34$b$-3 and an insert pattern among the insert patterns 34$b$-1, wherein the insert pattern is most adjacent to the second basic pattern 34$b$-3. Further, according to the current embodiment of the present invention, it is possible to remove a burden due to asymmetry resulting from a photolithography process.

FIGS. 4A through 4D illustrate cross-sectional views of stages describing a method of manufacturing a semiconductor device according to another embodiment of the present invention.

Figure 4A:
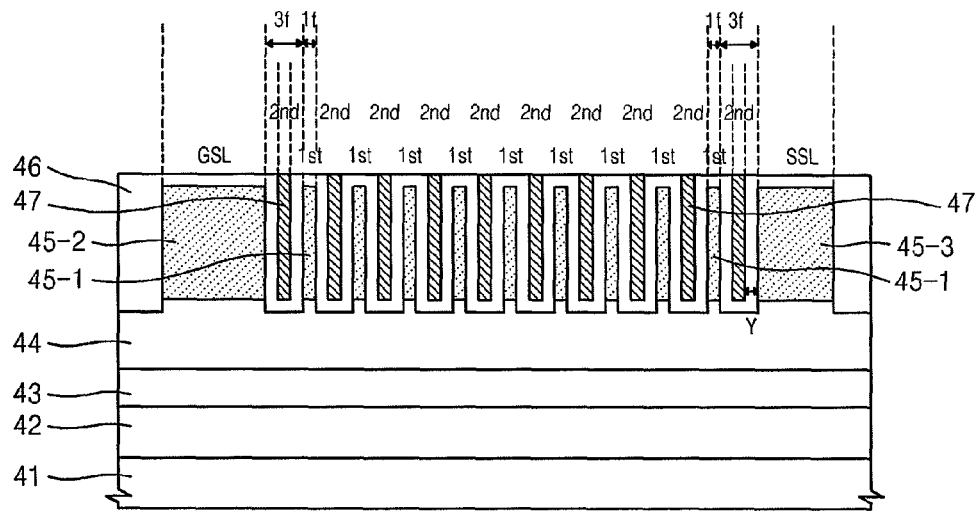
FIGS. 4A through 4D illustrate cross-sectional views of stages in a method of manufacturing a semiconductor device according to another embodiment of the present invention.

Referring to FIG. 4A, a first material layer 44 is formed on a semiconductor substrate 41. After that, first patterns 45-2, 45-3, and 45-1 of a second material layer are formed on the first material layer 44, wherein the first patterns 45-2, 45-3, and 45-1 respectively correspond to a region of a first basic pattern 44$b$-2, a region of a second basic pattern 44$b$-3, and a region of a first insert pattern to be formed in a subsequent process. After that, a first pattern 46 of a third material layer is formed on the first patterns 45-2, 45-3, and 45-1 to form a plurality of first spaces between the first patterns 45-2, 45-3, and 45-1 which are adjacent to each other, and then first patterns 47 of a fourth material layer are formed on the first pattern 46 to cover the plurality of the first spaces. This procedure is the same as that described with reference to FIGS. 1A through 1D and thus, a detailed description thereof will be omitted here.

Figure 4B:
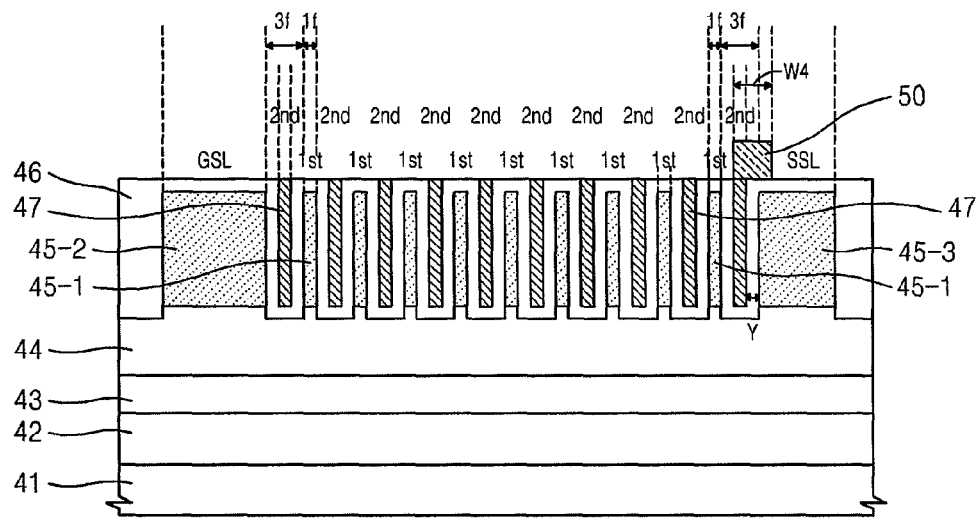

Referring to FIG. 4B, a shielding layer pattern 50 is formed to completely cover a top surface of the first pattern 46 that is disposed between the first pattern 45-3 and a first pattern among the first patterns 47, wherein the first pattern 45-3 is on the region of the second basic pattern 44$b$-3 to be formed in a subsequent process, and the first pattern among the first patterns 47 is most adjacent to the first pattern 45-3. That is, the shielding layer pattern 50 may be extended from the first pattern, which is most adjacent to the first pattern 45-3, to the first pattern 45-3 in the region of the second basic pattern 44$b$-3 to be formed in a subsequent process.

A width of the shielding layer pattern 50 may be preferably greater than a width (refer to Y in FIG. 4B) of the first pattern 46 contacting a side surface of the first pattern 45-3. For example, the width of the shielding layer pattern 50 may correspond to a third feature size 3f whereas the width (Y) of the first pattern 46 contacting a side surface of the first pattern 45-3 may correspond to the first feature size 1f.

Figure 4C:
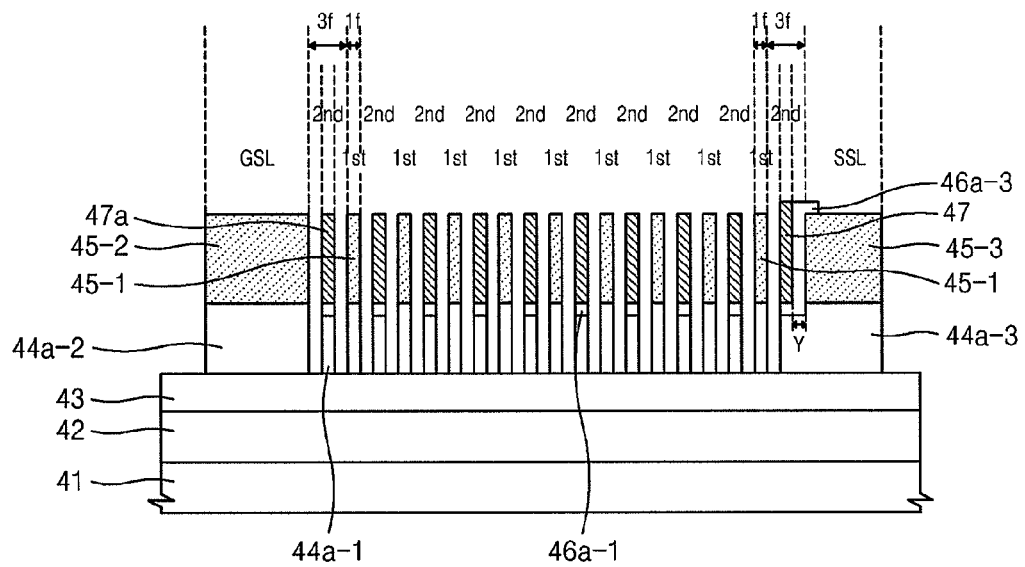

Referring to FIG. 4C, the first patterns 45-2, 45-3, and 45-1 of the second material layer, the first pattern 47 of the fourth material layer, and the shielding layer pattern 50 are used as an etching mask to etch the first pattern 46 of the third material layer, and then to etch the first material layer 44, to form first patterns 44a-2, 44a-3, and 44a-1 of the first material layer 44.

A vertical thickness of the shielding layer pattern 50 should be sufficient to enable the shielding layer pattern 50 to remain as the etching mask while the first pattern 46 and the first material layer 44 are etched.

Figure 4D:
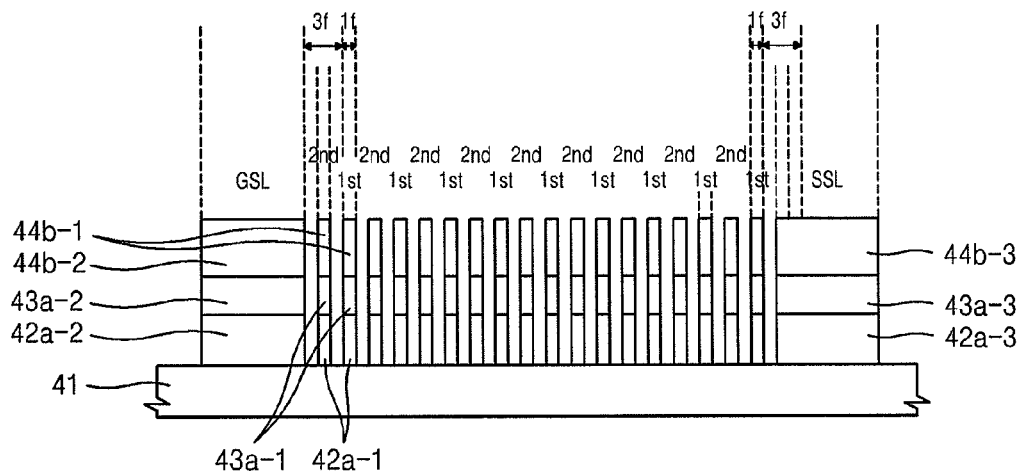
Figure 5:
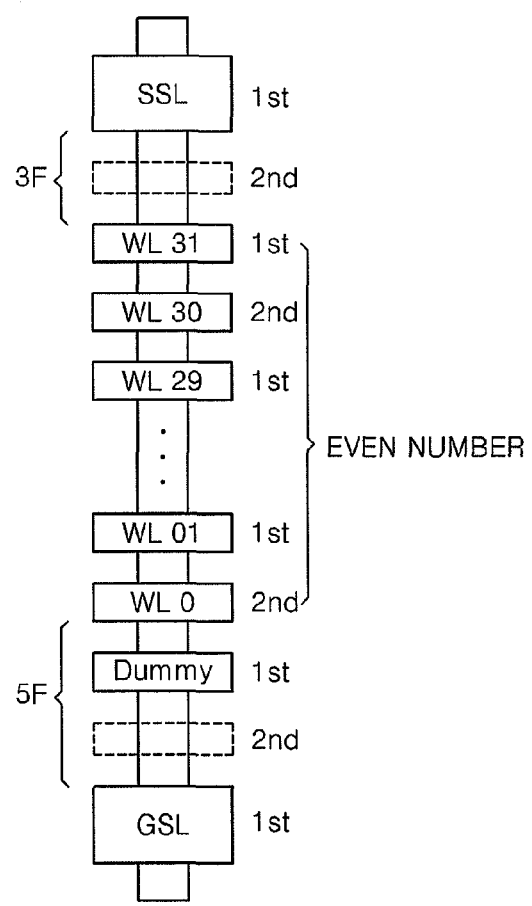
FIG. 5 illustrates a plane view of a semiconductor device formed using a conventional double patterning method.

Referring to FIG. 4D, the first patterns 45-2, 45-3, and 45-1 of the second material layer, the first patterns 47 of the fourth material layer, and the shielding layer pattern 50 are removed, and the first patterns 44a-2, 44a-3, and 44a-1 of the first material layer 44 are used as an etching mask to sequentially etch the exposed tungsten layer 43 and the exposed TANOS layer 42, and then to form tungsten layer patterns 43a-1, 43a-2, and 43a-3, and TANOS layer patterns 42a-1, 42a-2, and 42a-3, so that a gate pattern is formed. Thicknesses of the first material layer's (44) first patterns 44b-2, 44b-3, and 44b-1 being used as the etching mask during the etching process may be slightly reduced. The first material layer's (44) first patterns 44b-2, 44b-3, and 44b-1 constitute the first basic pattern 44b-2, the second basic pattern 44b-3, and first and second insert patterns (hereinafter, insert patterns) 44b-1.

A horizontal width of each insert pattern 44b-1 may correspond to a first feature size 1f. A distance between each adjacent insert pattern 44b-1 may correspond to the first feature size 1f.

A distance between the first basic pattern 44b-2 and an insert pattern among the insert patterns 44b-1, wherein the insert pattern is most adjacent to the first basic pattern 44b-2, is the same as a distance between the second basic pattern 44b-3 and an insert pattern among the insert patterns 44b-1, wherein the insert pattern is most adjacent to the second basic pattern 44b-3. For example, the distance between the first basic pattern 44b-2 and the insert pattern most adjacent to the first basic pattern 44b-2 may correspond to the first feature size 1f, and the distance between the second basic pattern 44b-3 and the insert pattern most adjacent to the second basic pattern 44b-3 may also correspond to the first feature size 1f.

The third material layer should have etch selectivity not equal to one with respect to the second material layer, the fourth material layer, and the shielding layer pattern 50. Also, the first material layer 44 should have etch selectivity not equal to one with respect to the second material layer, the fourth material layer, and the shielding layer pattern 50.

For example, in the current embodiment of the present invention, the first material layer 44, the second material layer, the third material layer, the fourth material layer, and the shielding layer pattern 50 may respectively include a silicon oxide layer, a poly-silicon layer, a silicon oxide layer, a poly-silicon layer, and a photoresist layer pattern.

Figure 6:
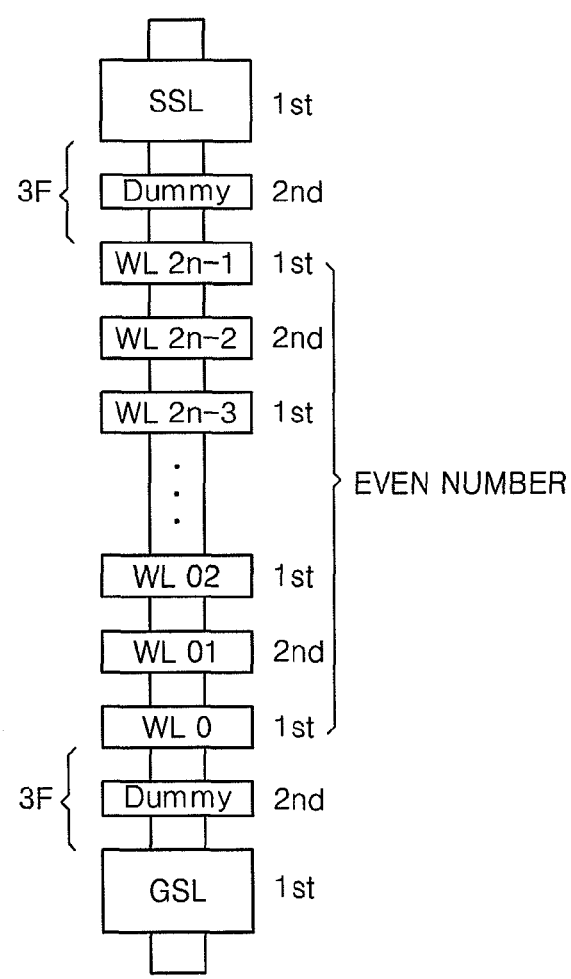
FIG. 6 illustrates a plane view of a semiconductor device formed using a double patterning method according to an embodiment of the present invention.

FIG. 6 illustrates a plane view of a semiconductor device formed using a double patterning method according to an embodiment of the present invention.

Referring to FIG. 6, an even number of insert patterns are formed between a first basic pattern (e.g., a GSL pattern) and a second basic pattern (e.g., an SSL pattern). In the case where an even number of insert patterns among the insert patterns are used as word line patterns WL0 through WL2n−1, a dummy pattern is used between the first basic pattern (e.g., the GSL pattern) and the word line pattern WL0, and a dummy pattern is used between the second basic pattern (e.g., the SSL pattern) and the word line pattern WL2n−1. Thus, unlike in the case of the conventional technology, the current embodiment of the present invention may have a structure that is symmetrical around the word line patterns.

According to the present invention, the even number of insert patterns can be formed between a first basic pattern disposed at a left side and a second basic pattern disposed at a right side by double patterning.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device in which an even number of insert patterns are formed by double patterning between a first basic pattern disposed at a left side and a second basic pattern disposed at a right side which are transversely separated from each other on a semiconductor substrate, wherein a first insert pattern and a second insert pattern are alternately repeated to form the insert patterns, the method comprising:

(a) forming a first material layer on the semiconductor substrate;

(b) forming first patterns of a second material layer on the first material layer, wherein the first patterns of the second material layer respectively correspond to a region where the first basic pattern, a region where the second basic pattern, and a region where the first insert pattern are to be subsequently formed;

(c) forming a first pattern of a third material layer on the first patterns of the second material layer so as to form a plurality of first spaces between the adjacent first patterns;

(d) forming first patterns of a fourth material layer on the first pattern of the third material layer, thereby filling the plurality of first spaces;

(e) forming a shielding layer pattern to completely cover a top surface of the first pattern of the third material layer between a first pattern among the first patterns of the second material layer, and a first pattern among the first patterns of the fourth material layer, wherein the first pattern among the first patterns of the second material layer is on the region where the second basic pattern is to be subsequently formed, and wherein the first pattern among the first patterns of the fourth material layer is most adjacent to the first pattern among the first patterns of the second material layer; and (f) using the first patterns of the second material layer, the first patterns of the fourth material layer, and the shielding layer pattern as an etching mask to etch the first pattern of the third material layer, and then to etch the first material layer, thereby forming a first pattern of the first material layer including the first basic pattern, the second basic pattern, the first insert pattern, and the second insert pattern.

2. The method as claimed in claim 1, wherein the shielding layer pattern is extended from the first pattern among the first patterns of the fourth material layer to the first pattern among the first patterns of the second material layer, wherein the first pattern among the first patterns of the fourth material layer is most adjacent to the first pattern among the first patterns of the second material layer, and which are on the region where the second basic pattern is to be subsequently formed.

3. The method as claimed in claim 1, wherein the shielding layer pattern has a vertical thickness sufficient to enable the shielding layer pattern to remain as the etching mask while the etching is performed in (f).

4. The method as claimed in claim 1, wherein the third material layer has etch selectivity not equal to one with respect to the second material layer, the fourth material layer, and the shielding layer pattern.

5. The method as claimed in claim 1, wherein the first material layer has etch selectivity not equal to one with respect to the second material layer, the fourth material layer, and the shielding layer pattern.

6. The method as claimed in claim 1, wherein the first material layer, the second material layer, the third material layer, the fourth material layer and the shielding layer pattern comprise a silicon oxide layer, a poly-silicon layer, a silicon oxide layer, a poly-silicon layer, and a photoresist layer pattern, respectively.

7. The method as claimed in claim 1, wherein a horizontal width of each insert pattern corresponds to a first feature size, a distance between each adjacent insert patterns corresponds to the first feature size, a distance between the first basic pattern and an insert pattern among the insert patterns, wherein the insert pattern is most adjacent to the first basic pattern, corresponds to the first feature size, and a distance between the second basic pattern and an insert pattern among the insert patterns, wherein the insert pattern is most adjacent to the second basic pattern, corresponds to the first feature size.

8. The method as claimed in claim 1, wherein the distance between the first basic pattern and the insert pattern most adjacent to the first basic pattern is the same as the distance between the second basic pattern and the insert pattern most adjacent to the second basic pattern.

* * * * *